United States Patent [19]

Fulkerson

[11] 4,032,796

[45] June 28, 1977

[54] LOGIC DOT-AND GATE CIRCUITS

[75] Inventor: David E. Fulkerson, Minnetonka, Minn.

[73] Assignee: Honeywell Inc., Minneapolis, Minn.

[22] Filed: Mar. 26, 1976

[21] Appl. No.: 670,811

Related U.S. Application Data

[63] Continuation-in-part of Ser. No. 497,018, Aug. 13, 1974, Pat. No. 3,970,866.

[52] U.S. Cl. .............................. 307/218; 307/213; 307/215; 307/299 A; 357/15; 357/36
[51] Int. Cl.² ................. H03K 19/08; H03K 19/22
[58] Field of Search ............ 307/215, 218, 299 A, 307/213, 303; 357/36, 15

[56] References Cited

UNITED STATES PATENTS

| | | | |
|---|---|---|---|
| 3,233,125 | 2/1966 | Buie | 307/215 |
| 3,414,783 | 12/1968 | Moore | 307/215 X |
| 3,560,761 | 2/1971 | Kardash | 307/215 |
| 3,571,616 | 3/1971 | Andrews | 307/215 |
| 3,699,362 | 10/1972 | Jordan | 307/299 A |
| 3,751,680 | 8/1973 | Hodges | 307/213 |
| 3,790,817 | 2/1974 | Dobkin | 307/218 X |

Primary Examiner—John S. Heyman
Attorney, Agent, or Firm—Theodore F. Neils

[57] ABSTRACT

A logic family is provided capable of accomplishing a logic function for each transistor used, i.e. one transistor per logic gate. A plurality of logic gate types are shown, each capable of a different logic function. These logic gate types can be connected with one another to provide the "DOT--AND" logic function.

7 Claims, 8 Drawing Figures

4,032,796

LOGIC DOT-AND GATE CIRCUITS

REFERENCE TO RELATED APPLICATIONS

This application is a continuation-in-part of a copending patent application Ser. No. 497,018 now U.S. Pat. No. 3,970,866 filed Aug. 13, 1974, by David E. Fulkerson entitled LOGIC GATE CIRCUITS, which is assigned to the same assignee as the present invention.

BACKGROUND OF THE INVENTION

This invention relates to apparatus for providing logic circuits as logic gates to perform logical functions in combinational and sequential digital logic systems.

The advent of large scale integration has meant that monolithic integrated circuits are becoming available with more and more digital system functions provided therein to the point that substantial portions or all of a digital system are provided on a single chip. This increase in functional density and so in circuit density in a monolithic integrated circuit has several advantages. Substantial economies are realized in reduced assembly cost, etc. Improved reliability results because fewer interconnections need to be made among the devices making up the system. There is an increase in the rapidity of operation since signals which must be transmitted in the system can be transmitted over small distances.

These advantages and others motivate the desire to increase the number of logic gates in a monolithic integrated circuit device to further increase the logic function density in such a device. Additionally, to accomplish more rapidly the logic functions to be performed to thus improved the digital system capabilities, increasing the rapidity of operation of the logic gates used in a monolithic integrated circuit device is also very desirable. Yet, both increases in circuit density and in the rapidity of circuit switching operations tend to also increase the power dissipated in the monolithic integrated circuit device and so the method chosen to reach two goals must also provide for achieving a sufficiently low power dissipation if a viable monolithic integrated circuit device is to be realized.

Currently, the need for rapidly operating digital monolithic integrated circuit devices is met most commonly by transistor-transistor logic circuits (TTL), particularly Schottky-clamped TTL, and emitter-coupled logic (ECL). The logic gates provided in these logic families tend to use on the average more than one transistor per logic function accomplished. Use of one transistor per basic logical function would be quite desirable since the use of further transistors tends to require more space in a monolithic integrated circuit, tends to slow operation of the logic gate and tends to increase power consumption.

There have been attempts to develop new logic circuits to improve on the foregoing logic circuit families and to develop new logic families. Among these is a logic circuit shown in U.S. Pat. No. 3,769,524 to Mathews which teaches use of a NOR gate to perform logical functions. The circuitry shown in this patent teaches a somewhat simplified logic gate requiring relatively little power but still shows use of more than one transistor on the average in achieving the NOR logic function provided.

SUMMARY OF THE INVENTION

The present invention uses either multiple base or multiple emitter bipolar transistor or both to provide a logic family capable of accomplishing a basic logical function with the use of one transistor. Use of such transistors to accomplish a basic logical function per transistor used conserves the number of circuit components required and, when provided in a monolithic integrated circuit, substantial savings in space used and improvements in switching rapidity also ensue. Both of these latter gains are due again to the use of a single transistor to perform the logic function involved. Further, these circuits in monolithic integrated circuit form facilitate logic gate layouts therein due to the convenient logic gate interconnections permitted. Also, the logic family of the present invention allows connection to logic gates in the TTL and ECL logic families with little difficulty and without requiring substantial additional circuitry.

DESCRIPTION OF THE PREFERRED EMBODIMENTS

Figure 1:
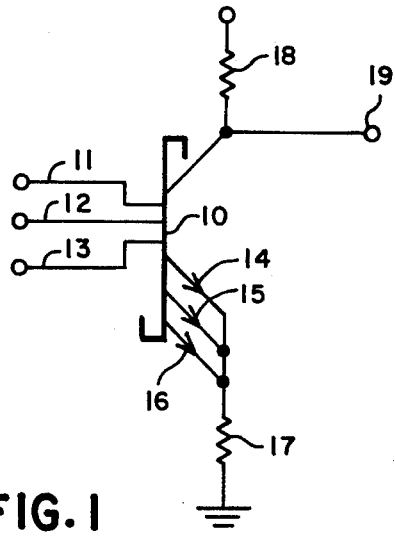
FIG. 1 shows an electrical schematic diagram of a portion of the present invention, a NOR gate.

FIG. 1 shows a circuit diagram for a logic gate for performing the NOR logical function which is constructed of a multiple base and multiple emitter bipolar transistor, 10, wherein an emitter is formed in each of several separate bases commonly provided in a collector region with these emitters internally shorted. Thus, effectively, a multiple base transistor is provided. A monolithic integrated circuit layout for a NOR gate including such a transistor is shown in a later drawing and the layout there is indicative of the construction of a discrete transistor having multiple bases and multiple emitters also.

Transistor 10 has three bases, bases 11, 12 and 13, and three corresponding emitters, emitters 14, 15 and 16. Bases 11, 12 and 13 serve as inputs to receive logic signals from a source of such signals such as another logic gate preceding the gate of FIG. 1.

An emitter resistor, 17, connected between the low value voltage supply terminal, shown in FIG. 1 as ground, and the emitter of transistor 10 is used to reduce "current-hogging" which occurs between the various base and emitter combinations present in transistor 10, i.e. base-emitter combination 11 and 14, base-emitter combination 12 and 15, and base-emitter combination 13 and 16. The use of resistor 17 reduces the "current-hogging" problem which plagued to old DCTL logic family but without the excessive use of space required by another solution to the DCTL problem which became the RTL logic family.

A load resistor, 18, connected between a terminal adapted for connection to the high value voltage supply and the collector of transistor 10, is used to provide a voltage swing at the NOR gate output, 19, in response to input signals at bases 11, 12 or 13. Transistor 10 is shown as a Schottky-clamped transistor, or Schottky transistor, which has a Schottky diode connected from base to the collector (cathode connected to the collector) to keep transistor 10 out of saturation so as to increase its switching rapidity.

The logic gate of FIG. 1 provides a NOR logic function between the base inputs 11 through 13 and output 19. If base 11, 12 or 13 is in high voltage logic state, then transistor 10 is on and output 19 is in the low voltage value logic state. With bases 11–13 all in the low state, transistor 10 is in the off condition and a load on ouput 19 has voltage and current applied to it through load resistor 18, and output 19 is in the high state. As is well known, any Boolean logic function may be realized by the use of NOR gates alone.

This NOR gate has many advantages when compared with the gates of the TTL and ECL logic families. There are advantages also when compared with the NOR gate taught in the above-referenced patent. The primary advantages follow from the use of a single transistor to realize the entire NOR logic function, i.e. a single collector region to contain the other transistor portions. The use of a single active device reduces space used in a monolithic integrated circuit in which the logic gate is to be provided to improve circuit density as compared with the use of two or more transistors to realize a logic function. The reduced size of the logic gate also means more rapid operation of the gate in switching from the low state to the high state or vice versa, in either monolithic integrated circuits or discrete devices. This is because the capacitance between the active devices and the substrate materials, usually silicon, is reduced by reducing the space taken up by whatever active devices are required to realize the logic functions.

Further, the NOR gate circuit of FIG. 1 can be operated at a substantially lower supply voltage than can either the standard TTL NAND gate or the standard ECL OR/NOR gate. This is due to the former circuit having but one $V_{BE}$ voltage drop occurring between the high voltage supply terminal and the low voltage supply terminal. The NOR gate circuit of FIG. 1 could operate at a supply voltage just exceeding 1 $V_{BE}$, but speed and power control dictate a somewhat higher voltage in practice. Use of a second type of gate circuit in the logic family of the present invention, as set out below, a supply voltage minimum of approximately 1½ $V_{BE}$, but again speed and power control lead to use of a somewhat higher voltage in practice.

The result of using a lower supply voltage compared to that used by another logic family, generally, is, first a lower voltage swing results which can increase the speed of the circuit since capacitances in the circuit need not be charged over as large a voltage swing. This potential improvement in operational rapidity may be nullified by voltage clamping due to the succeeding circuit connection to the output. Such clamping does occur among members of the logic family of the present invention as set out below. Secondly, the rapidity of operation of a logic gate is also increased, for a given gate power, when the voltage supplied to its is reduced since the current drive to charge the circuit capacitances can be increased without exceeding the given gate power.

A typical monolithic integrated circuit version of the logic circuit of FIG. 1 operated at a 2 volt supply voltage will have a power dissipation of 4 mw per gate and an average gate delay of less than a nanosecond. Resistor 17 in such a gate would be approximately 650 ohms while resistor 17 would be approximately 25 to 50 ohms.

Figure 2:
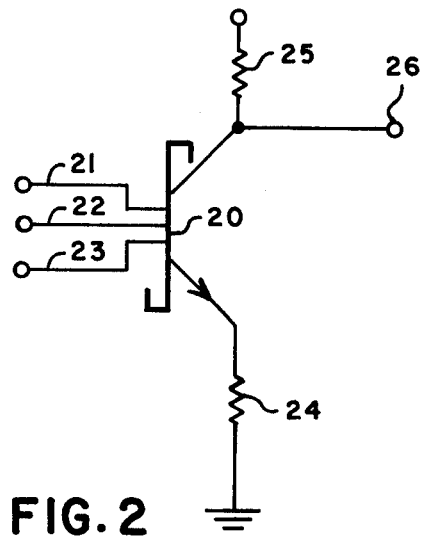
FIG. 2 shows an electrical schematic of a portion of the present invention, a NOR gate.

FIG. 2 shows the circuit diagram of another logic gate performing the NOR logical function using a multiple base, bipolar Schottky transistor, 20, having the multiple bases formed in a collector region common to them all and having a single emitter common to the multiple bases. The leads from the multiple bases are labeled 21, 22 and 23. Again, a resistor, 24, is used to limit "current-hogging" and a load resistor, 25, is used to provide a voltage swing at the output of the logic gate, 26.

The advantages of the NOR gate circuit shown in FIG. 2 are those of the NOR gate circuit shown in FIG. 1, but a transistor of even smaller physical size can be realized where but one emitter is used. For this kind of a transistor it is difficult to provide very many bases in the one transistor, i.e. a substantial fan-in, and some interaction occurs between the bases which must be controlled if the transistor is to be effectively a multiple base transistor. An example indicating a technique of providing a somewhat similar transistor is shown in U.S. Pat. No. 3,569,800 to Collins.

Figure 3:
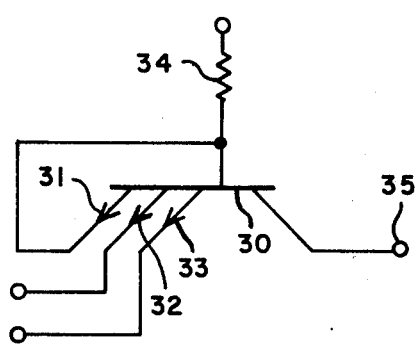
FIG. 3 shows an electrical schematic of a portion of the present invention, an AND gate.

As stated above, a NOR gate can perform all of the Boolean logic functions without any other type of logic gate being required. However, a logic gate performing another basic logical function can be useful if that particular logic function happens to be required in a digital system since only one logic gate is then needed to achieve this function rather than a combination of the preceding NOR gates. Hence, a further and compatible member of the logic family of the present invention has been found to be quite useful and is shown in FIG. 3, an AND gate. This gate, in addition, has some further advantages which will be set out below.

The logic gate shown in FIG. 3 to perform the AND logical function does so using a multiple emitter, bipolar transistor, 30, which has its multiple emitters formed in a single base region which in turn is formed in a collector region. The multiple emitters are labeled 31, 32 and 33. Emitter 31 is shorted internally to the base of transistor 30. Current is supplied to transistor 30 through a base resistor, 34, connected to a terminal adapted for connection to a voltage supply.

The AND logic function occurs between the inputs, which are emitters 32 and 33, and the output, 35, which is the collector lead to the transistor. When either or both emitter 32 and 33 emitter are in the low state, transistor 30 is in the "on" condition such that output 35 is also in the low state. When both emitter 32 and emitter 33 are in the high state, transistor 30 is in the "off" condition (actually transistor 30 is in the inverse transistor mode of operation) and the load to which output 35 is connected receives current and voltage through base resistor 34 and the base-collector junction of transistor 30, and output 35 is in the high state.

A difficulty with the NOR gates of the present invention described above is the relatively limited fan-out when the other NOR gates are used as loads. This is due both to the "current-hogging" problem which exists to a degree even with the use of the emitter resistors in these gates and to the limited amount of current which these gates can source. Use of AND gates of the kind shown in FIG. 3 as the only kind of loads for the output of one of the above NOR gates can at least double the fan-out capabilities of the NOR gate. This improved fan-out is due to the relatively little current that each of these AND gates sinks (i) when at least one input emitter is in the high state and at least one other input emitter is in the low state, or (ii) when the logical AND condition is satisfied with all input emitters in the high state resulting in transistor 30 of FIG. 3 going into the "off" condition, or as pointed out above, into the inverse mode of operation.

In the inverse mode of operation, the designed emitters of transistor 30 are operated as collectors and the designed collector of transistor 30 is operated as an emitter, such that the preceding, i.e. driving, logic stage becomes the collector load for the inversely operated transistor 30. Each AND gate, connected as a load to the input of a driving NOR circuit, which has its AND logical function satisfied, and so has the transistor therein operating inversely, draws an inverse collector current from the NOR gate. A current is also drawn in the other case i.e. input emitters in opposite states, due to the always forward biased collector-base junction (forward biased in nearly all circumstances) facilitating passing of current between those emitters in opposite states. These are the currents to be kept low to achieve a substantial fan-out of AND gate circuit loading the NOR gate.

To keep these currents low which the transistor in an AND gate is drawing through input emitters in the high state from the preceding NOR gate requires either that the transistor itself draw little current through these emitters or that the current drawn be supplied primarily from some source other than the preceding NOR gate or both. Shorting emitter 31 to the base of transistor 30 accomplishes supplying current to high state emitters in a manner such that the transistor 30 has a source of high state emitters current other than the preceding logic state.

The current otherwise drawn through those emitters of transistor 30 which are in the high state is supplied instead through base resistor 34 and the short from the base to emitter 31. By making the effective area of emitter 31 larger than the area of emitters 32 and 33, nearly all of the current required by transistor 30 with one or more emitters in the high state will be supplied via base resistor 34 and emitter 31. Thus the AND gate of FIG. 3 provides a very substantial advantage in the logic family of the present invention by allowing an increased fan-out from a NOR gate.

This use of a bipolar transistor having an emitter shorted to a base therein in a non-inverting switching operation (where an input, in switching a transistor from on to another condition, and vice versa, goes to the same logic state as the output, i.e. both switch to the high state or both switch to the low state), as in the AND gate of FIG. 3, is to be contrasted with the use of an emitter shorted to the base in a transistor which is used in inverted switching operations (where an input, in switching a transistor from on to another condition, and the vice versa, goes to the opposite logic state of the output, i.e. the input goes low as the output goes high and vice versa). When used in inverted switching operation transistors, the shorting of an emitter to the base is for the entirely different purpose of reducing charge storage, and so deep saturation, to speed up the switching rapidity of the transistor used in the inverting switching operation. An example of such use can be found in U.S. Pat. No. 3,233,125 to Buie.

Another very important advantage of the AND gate of FIG. 3 is the extreme rapidity of operation which it can achieve, a rapidity exceeding that of the preceeding NOR gate. This high rapidity of operation is achieved without use of a Schottky transistor as is noted by use of the standard symbol for transistor 30 in FIG. 3 rather than a Schottky transistor symbol. This rapidity follows directly from the use of transistor 30 in a non-inverting switching mode, as noted above, such that whatever saturation occurs acts to aid the switching rapidity of the transistor rather than slow it, thus obviating the need for connecting a Schottky diode from the base to the collector of the transistor. This can be understood by noting that the effective Miller capacitance in the transistor acts to slow the rapidity of switching for a transistor operating in the inverting switching mode, but acts to aid rapidity of switching in a transistor operating in a non-inverting switching mode.

A further advantage in the use of the AND gate is that it can be smaller than the NOR gate set out above as a result of only needing to form multiple emitters in a single base region in transistor 30 with no special base region geometry required. This tends to reduce the size of transistor 30 as compared to transistors effectively having multiple bases and, as will be seen below, the use of multiple emitters also aids in reducing the layout room required in a monolithic integrated circuit by facilitating interconnection between logic gates.

Figure 4:
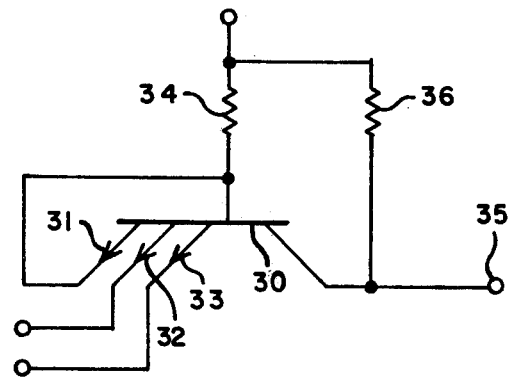
FIG. 4 shows an electrical schematic of a portion of the present invention, an AND gate.

FIG. 4 shows an improved version of the AND gate of FIG. 3, improved by the addition of a collector resistor, 36. This collector resistor primarily supplies the drive current to the load connected to the output of the AND gate of FIG. 4 when the logical AND function is satisfied at the inputs resulting in transistor 30 being in the "off" condition, i.e. operating in the inverse mode. This current must be supplied through the base resistor 34 and the forward biased collector junction of transistor 30 in FIG. 3. In FIG 4, base resistor 34 can be of a much larger value since most of the current supplied to the load of the logic gate in FIG. 4 is supplied through resistor 36.

Increasing base resistor 34 has a number of advantages including reducing the inverse collector current drawn by transistor 30 when it is operating in the inverse mode and in reducing the variation in the current through base resistor 34 due to changes in the supply voltage and in the $V_{BE}$ of transistor 30. Such variations in the current in base resistor 34 lead to variations in the power consumed in the logic gate and its speed of operation. Further, the parasitic PNP transistor, occurring in the base and collector of transistor 30 plus the substrate when this logic gate is fabricated in a monolithic integrated circuit, no longer affects the current drive to the load on the logic gate of FIG. 4 connected to output 35. This is so since this current drive is now supplied through collector resistor 36. Use of collector resistor 36 also reduces the undesirable current which is supplied through the emitters of the AND gate to preceding logic gates in low logic states which are connected to those emitters of the AND gate.

Typical values for the resistors in FIG. 4 are 5,000 ohms for resistor 34 and 650 ohms for resistor 36 when 2 volts is supplied at the voltage supply terminal to which resistors 34 and 36 are connected.

Figure 5:
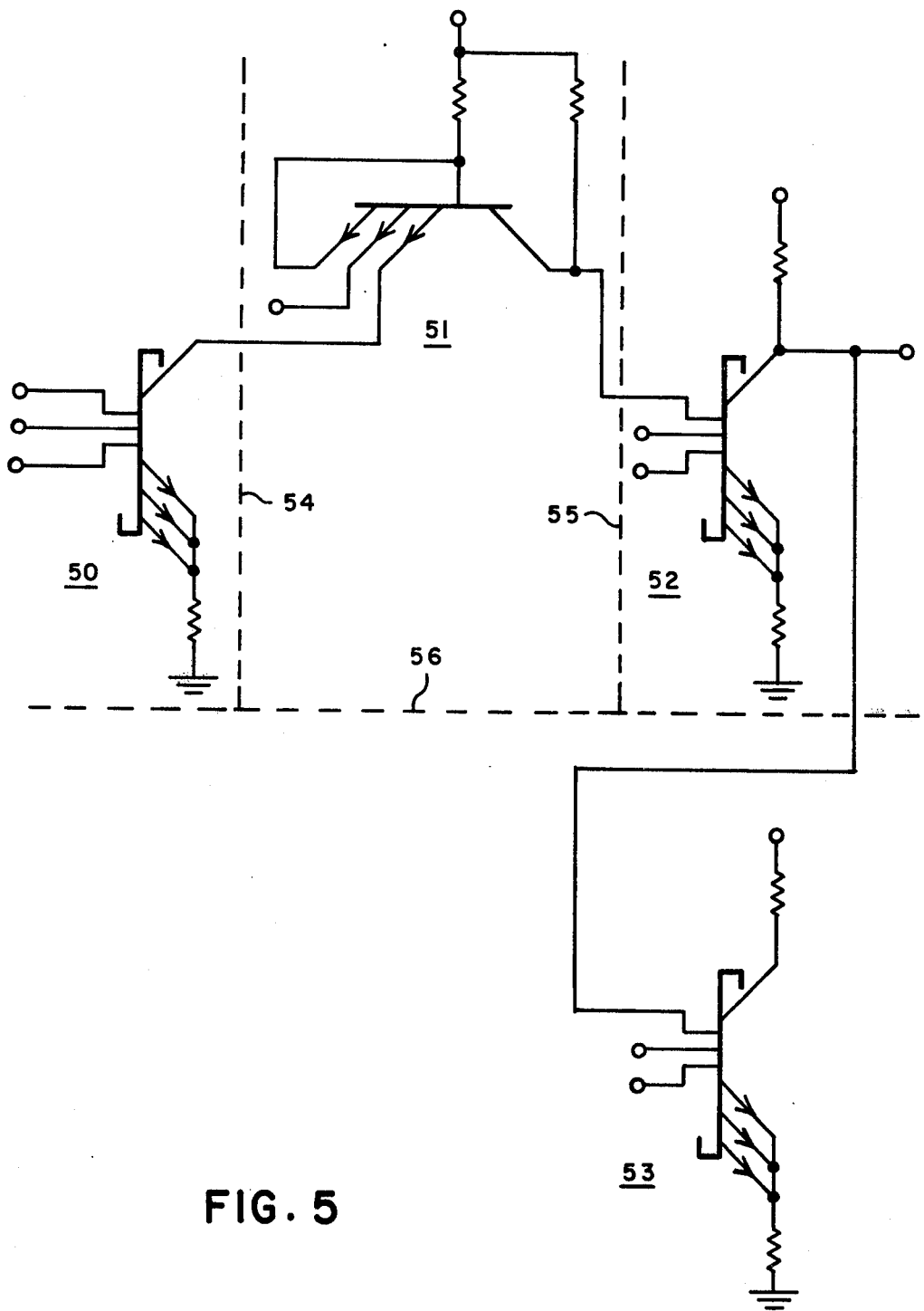
FIG. 5 shows an electrical schematic of a logic circuit of several stages using the foregoing logic gates.

Turning now to FIG. 5, a four stage logic circuit is shown using the logic gates described above, one logic gate per stage, to show some typical logic gate combinations. The four logic gates are labeled with a first gate, 50, being a NOR gate, a second gate, 51, being an AND gate, a third gate, 52, being a NOR gate and a fourth gate, 53, being a NOR gate also. Each of these logic gates are marked off from one another by dotted lines 54, 55 and 56. The logic gates shown in FIG. 5 are the NOR gate of FIG. 1 and the AND gate of FIG. 4, although the gates of FIGS. 2 and 3 could just as well have been substituted, respectively.

The only difference appearing between the gates used in FIG. 5 and the gates shown in FIGS. 1 and 4 is the omission of the collector resistor in NOR gate 50 when compared with the NOR gate of FIG. 1. Since NOR gate 50 need only sink current from AND gate 51 there is no need for a collector resistor to supply any current to AND gate 51 and so the collector resistor may be omitted to conserve space and power in a monolithic integrated circuit. As set out above, the power supplied to AND gate 51 and its load is obtained through the base and collector resistors therein.

This combination of logic gates shown in FIG. 5 allows estimating what the high and low logic state voltage levels will be for the logic gates in FIGS. 1 and 4 when these same gates are interconnected with one another and thereby serve as loads on the outputs of one another. First, consider NOR gates 52 and 53. When NOR gate 52 has its output in the low state, i.e. when the transistor in NOR gate 52 is in the on condition, clearly the transistor of NOR gate 53 is in the off condition. In this situation the voltage at the output of NOR gate 52, the same voltage obviously as that at the pertinent input of NOR gate 53, is the $V_{BE}$ drop of the transistor in NOR gate 52 minus the forward voltage drop of the Schottky diode in NOR gate 52, i.e. ($V_{BE}$ − $V_{Sch}$), ignoring the small drop across the relatively small emitter resistor or NOR gate 52.

On the other hand, when the transistor of NOR gate 52 is in the off condition the voltage at the output of NOR gate 52, again the voltage at the pertinent input of NOR gate 53, is clamped at the $V_{BE}$ drop of NOR gate 53, ignoring the small drop across the relatively small emitter resistor of NOR gate 53. Thus, the voltage at the output of NOR gate 52 and the input of NOR gate 53 swings between the $V_{BE}$ of NOR gate 53 when the NOR gate 52 is in the high state and ($V_{BE}$ − $V_{Sch}$) of NOR gate 52 when NOR gate 52 is in the low state.

When the transistor of AND gate 51 is in the "off" condition, i.e. when operating in the inverse mode, the output of AND gate 51 is in the high state and the voltage at its output, or the voltage at the input of NOR gate 52, is the $V_{BE}$ drop of NOR gate 52 ignoring the drop across the emitter resistor of that gate. In this situation the input of AND gate 51 (the output of NOR gate 50 also) is also in the high state and analysis shows that the voltage level at the juncture between these two gates is about one $V_{BE}$ drop just as it would be if NOR gate 50 were driving another NOR gate.

When the transistor of NOR gate and the transistor of AND gate 51 are both in the on condition, the voltage at the juncture between these two gates is in the low state and will again by the ($V_{BE}$ − $V_{Sch}$) drop of the transistor of NOR gate 50. The voltage at the connection between AND gate 51 and NOR gate 52 will then be above the voltage at the juncture between gates 50 and 51 by the saturation voltage of the transistor of gate 51.

A further advantage of the present logic family is the possibility of the use of wired logic. The outputs of one of the NOR gates shown in either of FIGS. 1 and 2 may be directly connected to another or more of these same logic gates to provide the "DOT--AND" logic function. Of course, it may be desirable to omit the load resistor in all but one of the joined NOR logic gates so that power dissipation in any of these gates in the low state will not be unsatisfactorily high.

Figure 6:
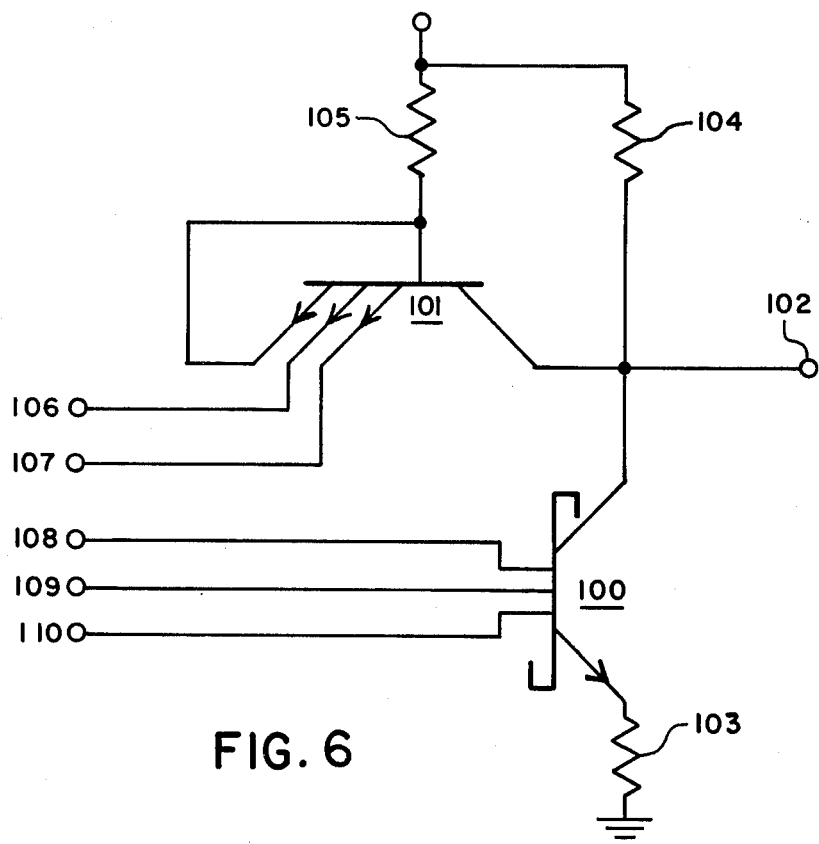
FIG. 6 shows an electrical schematic of a logic circuit performing the "DOT--AND" logic function of the present invention.
Figure 7:
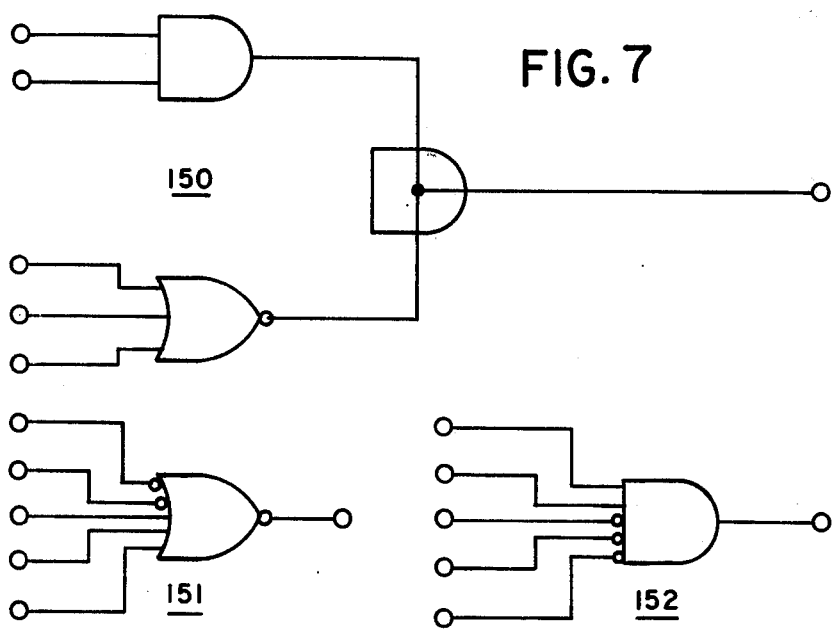
FIG. 7 shows logic gate symbols for the circuit of FIG. 6.

A NOR logic gate from either FIG. 1 or FIG. 2 may also be used in a wired logic combination with an AND logic gate from either FIGS. 3 or 4. This is shown in FIG. 6 where a NOR logic gate from FIG. 2 is combined at its output with an AND logic gate from FIG. 4 to also perform the "DOT--AND" logic function as is shown symbolically by the upper logic gate symbol diagram, 150, in FIG. 7. Either the collector resistor from the AND gate of FIG. 4 or the load resistor from the NOR logic gate of FIG. 2 has been removed in the circuit of FIG. 6 so that satisfactory power dissipation is achieved.

The "DOT--AND" logic gate of FIG. 6 has multiple base transistor 100 and multiple emitter transistor 101 joined at their collectors to provide output 102. The emitter resistor, 103, can again be approximately 50 ohms while the output resistor, 104, can again be 650 ohms. The base resistor, 105, for transistor 101 can again be 5000 ohms. Two of the five inputs shown are emitters of transistor 101, that is, inputs 106 and 107, while the remaining inputs are bases of transistor 100. These are inputs designated as 108, 109 and 110. Resistors 104 and 105 are adapted to be connected to a voltage supply source as is resistor 103 which is shown here having one end thereof at ground potential.

The logic gate of FIG. 6 in use is driven by and in turn drives a NOR logic gate of the type shown in FIGS. 1 and 2 leading to the inputs 106 through 110 in operation switching between voltage levels already described in connection with FIG. 5 for corresponding inputs. The voltage swing in operation at the output 102 of the logic gate in FIG. 6 will be just that described in FIG. 5 for comparable device outputs when just one or the other of transistors 100 and 101 are acting to place the output 102 in a low voltage state. However, when both transistors are acting to place output 102 in a low voltage state, the voltage value of the low voltage state will be that associated with transistor 100 acting alone. In the high state, the output voltage swing will be limited by the succeeding NOR logic gate in the manner described in connection with FIG. 5.

The logic gate of FIG. 6 will be in a high state only when the inputs 108 through 110 are in the low voltage state and the inputs 106 and 107 are in the high voltage state. Hence, the function performed is the "DOT--AND" logic function as symbolized by diagram 150 in FIG. 7. Equivalent logic gate symbols are shown by each of the remaining two logic gate symbols in FIG. 11, 151 and 152.

Figure 8:
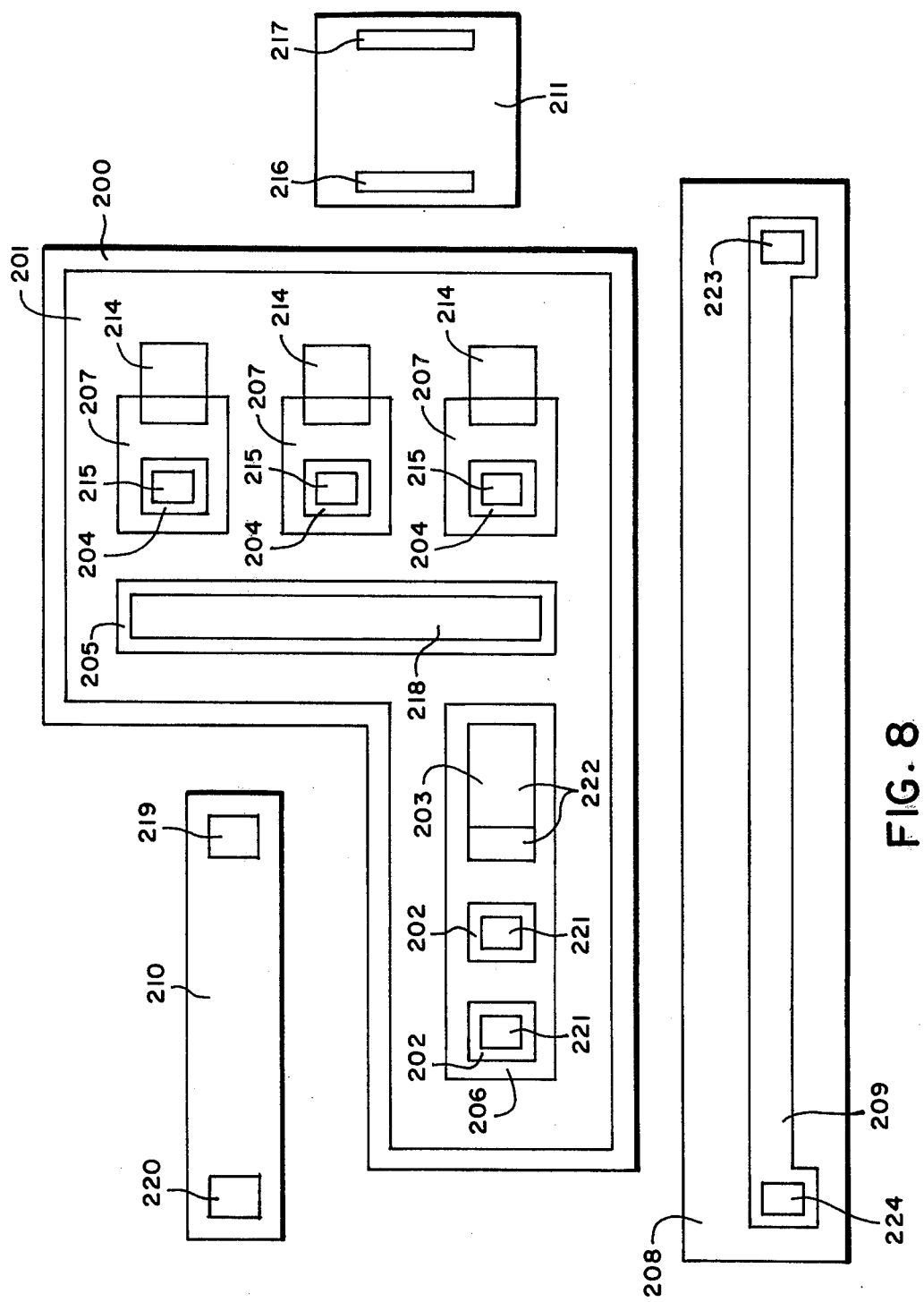
FIG. 8 shows a monolithic integrated circuit layout of a logic gate of the present invention.

Both transistor functions in the circuit of FIG. 6 can be provided in a single isolated area in a monolithic integrated circuit to reduce the area taken up by the logic gate and the associated capacitance with the result being increased speed of operation. FIG. 8 shows a top view of one possible layout for the logic gate of FIG. 6 in a monolithic integrated circuit. The metallization for the integrated circuit is not shown in FIG. 8. FIG. 8 shows use of the NOR logic gate from FIG. 1 rather than that from FIG. 2, the latter having been used in FIG. 6.

An isolating region of p-type conductivity 200, is formed by diffusion into an n-type conductivity epitaxial layer region 200 shown surrounding an isolated region of that epitaxial layer, 201.

Base regions of p-type conductivity are provided to form the base, 206, for the AND logic gate portion and the base, 207, for NOR logic gate portion. These regions are provided in a single diffusion. Two base regions, 210 and 211, are provided in this diffusion to form resistors, region 210 corresponding to resistor 104 in Figure and region 211 corresponding to resistor 103. During the isolating diffusion providing region 200, other isolating regions can be provided to form expitaxial resistors. In FIG. 8, region 208 is formed by this diffusion to isolate region 209 which will serve as an epitaxial resistor corresponding to resistor 105 in FIG. 6.

Emitter regions of n+-type conductivity are provided in a single diffusion to form the emitters, 202, associated with the AND logic gate portion and to form the enlarged emitter therefor, 203. In addition, the emitters, 204, associated with the NOR logic gate portion is formed simultaneously. The same emitter diffusion also forms the contact region for the collector, 205.

Several cuts are made in the covering of protective film, typically silicon dioxide, which is provided over the epitaxial layer as diffused to accommodate interconnection leads to electrically connect the various aforesaid regions with one another and with other regions of the monolithic integrated circuit chip to form electrical circuits. The cuts shown in FIG. 8 are made to accept a metallization deposition or, possibly, to accept a doped polysilicon deposition or some combination of the two for the purpose of forming these interconnection leads. Other interconnection means are known in the art also.

Cuts 214 expose the several bases 207 and several portions of isolated region 201 across the p-n junction formed between bases 207 and isolated region 201. Upon depositing metal in these cuts, a double contact, an ohmic contact to the base 207 and a Schottky or rectifying contact to the isolated region 201, is made with respect to each of the bases 207. Interconnections from other integrated circuit portions to these bases can be simultaneously provided. The result is Schottky diodes are provided, connected from each base 207 to isolated region 201 serving as a collector such that the diode cathode is connected to the isolated region 201, to thereby form a Schottky transistor. Inputs to the NOR logic gate portion of the logic gates shown in FIG. 8 extend from the electrical interconnections leading from cuts 214.

Cuts 215 permit ohmic contacts to be made to emitters 204 and to allow providing a short circuit between the emitters 204. These shorted emitters are further interconnected with cut 216 to connect the shorted emitters to the emitter resistor formed by region 212. Cut 217 permits this emitter resistor to be electrically connected to ground.

Cut 218 permits an ohmic collector contact to be made and an electrical interconnection to be made with the resistor provided by region 211 through cut 219. The output from the logic gate of FIG. 12 is also provided by this electrical interconnection. Cut 220 permits connecting the resistor formed by region 211 to the high level value voltage supply.

Cuts 221 have been made for input connections to the AND logic gate portion of the "DOT--AND" logic gate shown in FIG. 8. A further emitter contact cut, 222, has been made which extends beyond the enlarged emitter 203 and into the AND logic gate transistor base 206 across a portion of the p-n junction separating emitter 203 and base 206. A deposition in cut 222 will short the enlarged emitter 203 to the base 206 by forming an ohmic contact to each. Such a deposition will also be directed to form an electrical interconnection between the region exposed by cut 22 and that exposed by cut 223 to electrically connect the base of the AND logic gate portion to the resistor formed by region 212. Cut 224 permits electrical interconnection between this last resistor and the high level value voltage supply.

Thus, a compact and rapidly operating "DOT--AND" logic gate can be provided using the earlier described NOR and AND logic gates, as well as by using just the earlier described NOR logic gates. This logic operation capability can be quite convenient in designing a monolithic integrated circuit to accomplish some set of logic functions.

The embodiments of the invention in which an exclusive property or right is claimed are defined as follows:

1. A circuit for performing logical functions including a "DOT--AND" function, said circuit comprising:
a non-inverting bipolar transistor having a non-inverting transistor base, a non-inverting transistor collector and a plurality of non-inverting transistor emitters therein, said non-inverting transistor emitters, including a first non-inverting transistor emitter, being inputs to receive signals from sources of signals excepting those said non-inverting transistor emitters which are directly connected to said non-inverting transistor base including a second non-inverting transistor emitter so connected;
an inverting bipolar transistor having an inverting transistor collector, inverting transistor emitter and a plurality of inverting transistor bases therein, said inverting transistor bases being inputs to receive signals from source of signals, said inverting transistor collector being directly connected to said non-inverting transistor collector; and
a first resistor connected between said non-inverting transistor base and a first terminal means adapted for connection to a voltage source, whereby a logic gate circuit capable of performing said "DOT--AND" function is provided.

2. The circuit of claim 1 wherein a second resistor is connected between said non-inverting transistor collector and a second terminal means adapted for connection to a voltage source.

3. The circuit of claim 1 wherein a third resistor is connected between said inverting transistor emitter and a third terminal means adapted for connection to a voltage source.

4. The circuit of claim 2 wherein said second terminal means is also said first terminal means.

5. The circuit of claim 2 wherein a third resistor is connected between said inverting transistor emitter and a third terminal means adapted for connection to a voltage source.

6. The circuit of claim 5 wherein said second terminal means is also said first terminal means.

7. The circuit of claim 5 wherein a Schottky diode is connected from one of said inverting transistor bases to said inverting transistor collector.

* * * * *